United States Patent
Demharter et al.

(10) Patent No.: US 11,079,255 B2
(45) Date of Patent: Aug. 3, 2021

(54) ANGLE DETERMINATION FOR A GENERATOR

(71) Applicants: ROLLS-ROYCE plc, London (GB); MTU FRIEDRICHSHAFEN GMBH, Friedrichshafen (DE); MTU ONSITE ENERGY GMBH, Augsburg (DE)

(72) Inventors: Johannes Demharter, Friedrichshafen (DE); Souvik Dasgupta, Singapore (SG); Michael Kreissl, Friedberg (DE); Amit K Gupta, Singapore (SG); Vsk Murthy Balijepalli, Singapore (SG)

(73) Assignees: ROLLS-ROYCE plc, London (GB); MTU FRIEDRICHSHAFEN GMBH, Friedrichshafen (DE); MTU ONSITE ENERGY GMBH, Augsburg (DE)

( * ) Notice: Subject to any disclaimer, the term of this patent is extended or adjusted under 35 U.S.C. 154(b) by 182 days.

(21) Appl. No.: 16/401,638

(22) Filed: May 2, 2019

(65) Prior Publication Data
US 2019/0368898 A1  Dec. 5, 2019

(30) Foreign Application Priority Data
May 30, 2018  (GB) ...................................... 1808798

(51) Int. Cl.
*G01D 5/242* (2006.01)
*H02P 9/00* (2006.01)

(52) U.S. Cl.
CPC ............. *G01D 5/242* (2013.01); *H02P 9/009* (2013.01); *H02P 9/006* (2013.01)

(58) Field of Classification Search
CPC .. H02P 6/16; H02P 9/009; H02P 9/006; H02P 21/18; G01D 5/242; G01R 21/06; G01R 21/006; G01R 31/346; Y02E 10/76
See application file for complete search history.

(56) References Cited

U.S. PATENT DOCUMENTS

| | | |
|---|---|---|
| 4,467,267 A | 8/1984 | Hucker et al. |
| 4,772,802 A | 9/1988 | Glennon et al. |
| (Continued) | | |

FOREIGN PATENT DOCUMENTS

| | | |
|---|---|---|
| EP | 2118996 A1 | 11/2009 |
| GB | 2519116 A | 4/2015 |
| (Continued) | | |

OTHER PUBLICATIONS

May 6, 2020 Notice of Allowance issued U.S. Appl. No. 16/401,570.
(Continued)

*Primary Examiner* — Huy Q Phan
*Assistant Examiner* — Dustin R Dickinson
(74) *Attorney, Agent, or Firm* — Oliff PLC

(57) ABSTRACT

A method determines a generator system load and/or rotor angle. The generator system has a generator with a generator terminal outputting electrical power generated by the generator, a transformer and a point of common coupling, PCC, terminal. The transformer is between the generator and PCC terminals. The method includes: determining the generator field current; determining the output voltage, the output current and the power factor and/or angle of the output voltage and output current from the generator terminal, and determining the load angle of the generator system, output voltage from the generator terminal, output current from the generator terminal and the power factor and/or angle; and/or determining the output voltage, the output current and the power factor and/or angle of the output voltage and output current, and determining the rotor angle of the generator system, output voltage, output current from the PCC terminal and the power factor and/or angle.

15 Claims, 5 Drawing Sheets

(56) References Cited

U.S. PATENT DOCUMENTS

| | | |
|---|---|---|
| 4,868,406 A | 9/1989 | Glennon et al. |
| 4,994,684 A | 2/1991 | Lauw et al. |
| 5,013,929 A | 5/1991 | Dhyanchand |
| 5,015,941 A | 5/1991 | Dhyanchand |
| 5,068,590 A | 11/1991 | Glennon et al. |
| 5,140,245 A | 8/1992 | Stacey |
| 5,225,712 A * | 7/1993 | Erdman ............... F03D 7/0276 290/44 |
| 5,384,527 A | 1/1995 | Rozman et al. |
| 5,418,446 A | 5/1995 | Hallidy |
| 5,430,362 A | 7/1995 | Carr et al. |
| 5,461,293 A | 10/1995 | Rozman et al. |
| 5,493,200 A | 2/1996 | Rozman et al. |
| 5,495,162 A | 2/1996 | Rozman et al. |
| 5,495,163 A | 2/1996 | Rozman et al. |
| 6,172,498 B1 | 1/2001 | Schmidt et al. |
| 6,617,972 B2 | 9/2003 | Takarada et al. |
| 7,301,310 B2 | 11/2007 | Ganev et al. |
| 7,821,145 B2 | 10/2010 | Huang et al. |
| 7,843,175 B2 | 11/2010 | Jakeman et al. |
| 8,278,883 B2 | 10/2012 | Dalby |
| 8,593,095 B2 | 11/2013 | Markunas et al. |
| 8,779,729 B2 | 7/2014 | Shiraishi |
| 10,205,415 B2 | 2/2019 | Blackwelder et al. |
| 2002/0093360 A1 | 7/2002 | Nagata |
| 2005/0216225 A1 | 9/2005 | Anghel et al. |
| 2007/0188184 A1 | 8/2007 | Athas et al. |
| 2007/0222220 A1 | 9/2007 | Huang et al. |
| 2008/0025052 A1* | 1/2008 | Yasumura ............ H02M 1/4241 363/21.04 |
| 2009/0174188 A1 | 7/2009 | Huang et al. |
| 2010/0025995 A1* | 2/2010 | Lang ..................... H02J 3/381 290/44 |
| 2010/0039077 A1 | 2/2010 | Dalby |
| 2011/0298406 A1* | 12/2011 | Tamai ..................... H02P 9/009 318/400.33 |
| 2012/0050053 A1 | 3/2012 | Kim |
| 2012/0098518 A1 | 4/2012 | Unagami et al. |
| 2013/0238273 A1 | 9/2013 | Tercariol et al. |
| 2014/0032138 A1* | 1/2014 | Shrestha ................ G06F 11/30 702/58 |
| 2016/0357207 A1 | 12/2016 | Desabhatla |
| 2017/0170764 A1 | 6/2017 | Blackwelder et al. |
| 2017/0176222 A1 | 6/2017 | Hosseini Dastjerdi et al. |
| 2018/0102725 A1 | 4/2018 | Fahringer et al. |
| 2019/0173403 A1 | 6/2019 | Blackwelder et al. |
| 2019/0288624 A1 | 9/2019 | Gupta et al. |
| 2019/0305703 A1* | 10/2019 | Holliday ............... H02K 7/183 |

FOREIGN PATENT DOCUMENTS

| | | |
|---|---|---|
| WO | 2008/102105 A1 | 8/2008 |
| WO | 2011/070520 A2 | 6/2011 |
| WO | 2013/102849 A2 | 7/2013 |
| WO | 2017/214499 A1 | 12/2017 |

OTHER PUBLICATIONS

Oct. 5, 2020 Office Action issued in U.S. Appl. No. 16/401,543.
Aug. 30, 2019 Extended Search Report issued in European Patent Application No. 19171872.5.
Aug. 23, 2019 Search Report issued in European Patent Application No. 19171872.
Sep. 2, 2019 Extended Search Report issued in European Patent Application No. 19171871.7.
Oct. 7, 2019 Extended Search Report issued in European Patent Application No. 19171873.3.
Jan Turcek et al. "Estimation of Load Angle Using Measured Parameters of Synchronous Machine". Elektro, 2012, IEEE, May 21, 2012, pp. 270-273.
Nov. 20, 2018 Search Report issued in British Patent Application No. 1808797.3.
Nov. 23, 2018 Search Report issued in British Patent Application No. 1808798.1.
Nov. 15, 2018 Search Report issued in British Patent Application No. 1808796.5.
IEEE Tutorial on the Protection of Synchronous Generators (second edition), Aug. 29, 2011, URL: <http://resourcecenter.ieee-pes.org/pes/product/tutorials/PESTP1001>.
Tomislav Idzotic et al. "Synchronous Generator Load Angle Measurement and Estimation". Automatika, vol. 45, No. 3-4, 2004, pp. 179-186.
D. Sumina et al. "Determination of Load Angle for Salient-Pole Synchronous Machine". Measurement Science Review, vol. 10, No. 3, 2010, pp. 89-96.
U.S. Appl. No. 16/401,570, filed May 2, 2019 in the name of Yang Shicong et al.
U.S. Appl. No. 16/401,543, filed May 2, 2019 in the name of Souvik Dasgupta et al.
Dec. 1, 2020 Notice of Allowance issued in U.S. Appl. No. 16/401,543.

* cited by examiner

ANGLE DETERMINATION FOR A GENERATOR

The present disclosure relates to the determination of a load angle and/or rotor angle in an electrical power generator driven by prime mover, such as reciprocating engine or gas/steam/wind turbine or motor etc. for a power grid application. The techniques disclosed herein provide accurate determination of the load angle and/or rotor angle during high load conditions when magnetic saturation of the generator is prominent. The techniques disclosed herein are particularly appropriate for detecting when an out-of-step condition has occurred.

There is a general need to improve known load angle and/or rotor angle determination techniques.

According to a first aspect there is provided a method of determining the load angle or rotor angle of a generator system, wherein the generator system comprises a generator with a generator terminal for outputting electrical power generated by the generator, a transformer and a point of common coupling, PCC, terminal, wherein the transformer is arranged between the generator terminal and the PCC terminal, the method comprising: determining the field current of the generator; determining the output voltage from the generator terminal, the output current from the generator terminal and the power factor angle and/or the power factor of the output voltage and output current from the generator terminal, and determining the load angle of the generator system in dependence on the determined field current, output voltage from the generator terminal, output current from the generator terminal and the power factor angle and/or the power factor; and/or determining the output voltage from the PCC terminal, the output current from the PCC terminal and the power factor angle and/or the power factor of the output voltage and output current from the PCC terminal, and determining the rotor angle of the generator system in dependence on the determined field current, output voltage from the PCC terminal, output current from the PCC terminal and the power factor angle and/or the power factor.

The method may comprise the generator system further comprising a mechanical drive system arranged to drive the generator so that the generator generates electrical power.

The method may comprise determining the output voltage and output current from the generator terminal and/or PCC terminal comprises measuring the properties of the output voltage and output current.

The method may comprise determining the field current of the generator by measuring the field current of the generator.

The method may further comprises filtering one or more of the determined output voltage, output current and field current to remove noise components.

The method may comprise determining the load angle and/or rotor angle of the generator system by: determining the open circuit voltage of the generator in dependence on the field current and the open circuit characteristics of the generator; and determining the load angle and/or rotor angle of the generator system in dependence on the determined open circuit voltage of the generator.

The method may comprise the open circuit characteristics of the generator being pre-determined data that has been one or more of calculated, simulated, estimated and measured.

The method may comprise the generator being a cylindrical rotor; and the load angle being determined as:

$$\delta = \theta + \cos^{-1}\left(\frac{V_t}{E}\cos\theta + \frac{RI_t}{E}\right)$$

where:
δ is the rotor angle;
$V_t$ is the rms value of the output voltage from the generator terminal;
$I_t$ is the rms value of the output current from the generator terminal;
E is the rms value of determined open circuit voltage;
θ is the power factor angle; and
R is the internal resistance of the generator.

The method may comprise the generator being a cylindrical rotor; and the rotor angle being determined as:

$$\delta = \theta + \cos^{-1}\left(\frac{V_p}{E}\cos\theta + \frac{RI_p}{E}\right)$$

where:
δ is the rotor angle;
V is the rms value of the output voltage from the PCC terminal;
$I_p$ is the rms value of the output current from the PCC terminal;
E is the rms value of determined open circuit voltage;
θ is the power factor angle; and
R is the internal resistance of the generator.

The method may comprise the generator being a salient pole machine; and the load angle being determined as:

$$\delta = \cos^{-1}\left(\frac{V_t}{[E - (X_d - X_q)\sin(\delta - \theta)I_t]}\cos\theta + \frac{RI_t}{[E - (X_d - X_q)\sin(\delta - \theta)I_t]}\right) + \theta$$

where:
δ is the rotor angle;
$V_t$ is the rms value of the output voltage from the terminal;
$I_t$ is the rms value of the output current from the terminal;
E is the rms value of determined open circuit voltage;
θ is the power factor angle;
R is the internal resistance of the generator;
$X_d$ is the nominal direct synchronous reactance; and
$X_q$ is the nominal quadrature axis synchronous reactance.

The method may comprise the generator being a salient pole machine; and the rotor angle being determined as:

$$\delta = \cos^{-1}\left(\frac{V_p}{[E - (X_d - X_q)\sin(\delta - \theta)I_p]}\cos\theta + \frac{RI_p}{[E - (X_d - X_q)\sin(\delta - \theta)I_p]}\right) + \theta$$

where:
δ is the rotor angle;
$V_p$ is the rms value of the output voltage from the PCC terminal;
$I_p$ is the rms value of the output current from the PCC terminal;
E is the rms value of determined open circuit voltage;
θ is the power factor angle;
R is the internal resistance of the generator (11);
$X_d$ is the nominal direct synchronous reactance; and
$X_q$ is the nominal quadrature axis synchronous reactance.

The method may comprise the electrical power output from the generator system being less than 30 MW.

According to a second aspect there is provided a method of determining whether or not an out-of-step condition has occurred, the method comprising: determining a load angle and/or rotor angle of a generator system according to the method of the first aspect; and determining whether or not an out-of-step condition has occurred in dependence on the determined load angle and/or rotor angle.

According to a third aspect there is provided a generator system comprising: a generator with a generator terminal for outputting electrical power generated by the generator, a transformer and a point of common coupling, PCC, terminal, wherein the transformer is arranged between the generator terminal and the PCC terminal; and one or more computing devices configured to determine a load angle and/or rotor angle of the generator system according to the method of the first aspect and/or an out-of-step condition according to the method of the second aspect.

According to a fourth aspect there is provided a computer program that, when executed by a computing device, causes the computing device to determine a load angle and/or rotor angle of a generator system according to the method of any of the first aspect and/or an out-of-step condition according to the method of the second aspect.

According to a fifth aspect there is provided a computing device configured to determine a rotor angle of a generator system and/or an out-of-step condition by executing the computing program of the fourth aspect.

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

Embodiments will now be described by way of example only, with reference to the Figures, in which.

Figure 4:
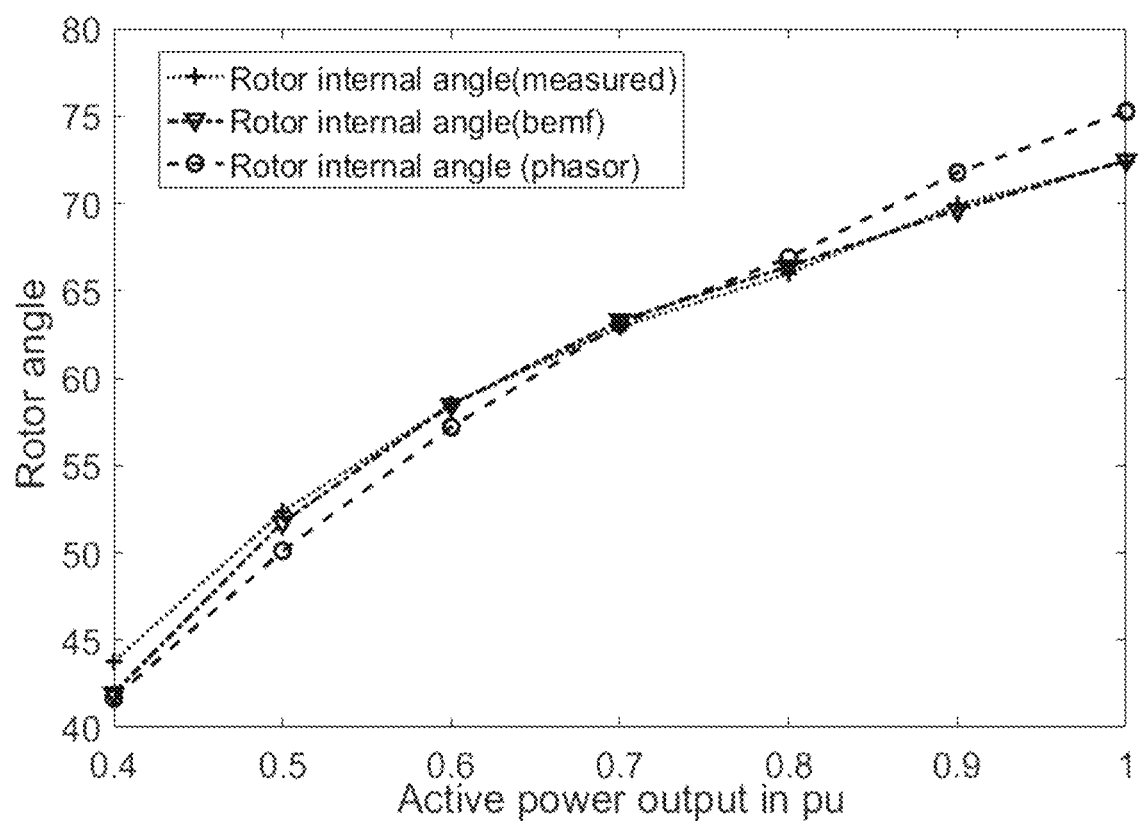
Figure 5:
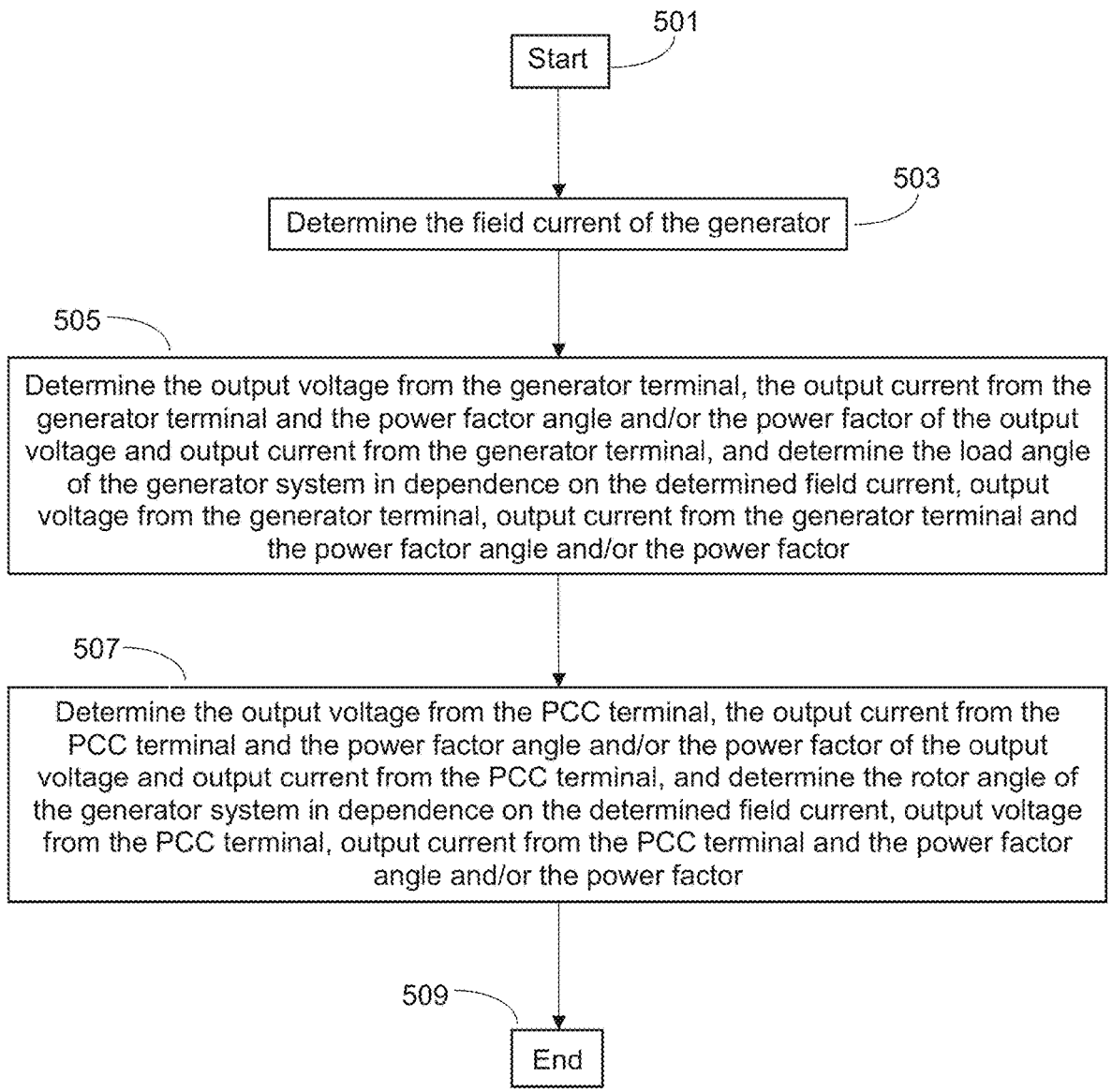

FIG. 4 demonstrates an advantage of the rotor angle determination according to an embodiment; and FIG. 5 is a flowchart of a process according to an embodiment.

The present disclosure provides an improved method of determining the load angle and/or rotor angle in an electrical power generator for a power grid.

In order to clearly present the context of the present disclosure, details of background technology are provided below.

Electrical power systems are exposed to a variety of abnormal operating conditions such as faults, generator loss, line tripping, and other disturbances that can result in power oscillations and consequent system instability. Under these conditions, appropriate relay settings are essential to ensure proper protection (i.e., the disconnection of generators that lose synchronism and the blocking of undesired operation of distance relays associated with high-voltage, HV, lines).

During normal operating conditions, the electric power output from a generator produces an electric torque that balances the mechanical torque applied to the generator rotor shaft. The rotor runs at a constant speed with the electric and mechanical torques balanced. When a fault occurs and the amount of power transferred is reduced, the electric torque that counters the mechanical torque is reduced. If the mechanical power is not reduced during the fault, the generator rotor will accelerate due to the unbalanced torque condition.

During an unstable power condition, at least two generators that provide power to a power grid rotate at different speeds to each other and lose synchronisation. This is referred to as an out-of-step condition (also referred to as a loss-of-synchronism condition or an out-of-synchronous condition).

An out-of-step condition causes high currents and mechanical forces in the generator windings and high levels of transient shaft torques. The torques can be large enough to break the shaft of a generator. Pole slipping events can also result in abnormally high stator core end iron fluxes that can lead to overheating and shorting at the stator core ends. The unit transformer will also be subjected to very high transient winding currents that impose high mechanical stresses on the windings.

Accordingly, if an out-of-step condition occurs, it is important that the generator or system areas operating asynchronously are quickly isolated from each other using out-of-step protection techniques.

Out-of-step protection is described in detail in at least: IEEE Tutorial on the Protection of Synchronous Generators (second edition), posted on 29 Aug. 2011, see http://resourcecenter.ieee-pes.org/pes/product/tutorials/PESTP1001 (as viewed on 14 Mar. 2018).

For a large power generation system, it is standard for an out-of-step detector, such as an impedance relay, to be used to determine if the generator is correctly synchronised with the power grid. However, out of step detectors are not normally provided for small synchronous generators, i.e. generators with a power output of less than 30 MW.

A particularly appropriate application for small synchronous generators is in smart grids. These are power grids with a variable number of power sources and adaptable power output from the power sources. Another particularly appropriate application for small synchronous generators is in micro grids. It is therefore desirable for small synchronous generators to be provided with out-of-step protection at a much lower cost than the out-of-step detection and prevention techniques that are currently used with large power generation systems.

A way of determining if a generator is operating correctly, or if an out-of-step condition has, or is about to, occur, is by determining and monitoring the rotor angle and/or the load angle of the generator. An accurate and low cost technique for determining the rotor angle and/or load angle of a generator is therefore desired.

A known and low cost technique for estimating the load angle of a generator is disclosed in D. Sumina, "Synchronous Generator Load Angle Measurement and Estimation", AUTOMATIKA 45(2004) 3-4, 179-186. This technique allows the load angle to be estimated from the measured output voltages and currents. However, the estimation of the load angle is dependent on reactances in the system. This technique is therefore not accurate during a high load condition when the high current causes magnetic saturation in the generator core. Accordingly, this technique is only suitable for the estimation of load angle when the system is in steady state operation and it cannot be used to estimate the load angle during the transient period for out-of-synchronous protection. In addition, the accuracy of this technique also decreases when there is a change in saturation in the alternator core due to a variation of the power required to a load.

Another known technique for estimating the load angle of a generator is disclosed in D. Sumina, "Determination of Load Angle for Salient-pole Synchronous Machine", MEASUREMENT SCIENCE REVIEW, Volume 10, No. 3, 2010. The load angle is measured using an optical encoder and digital control system.

Disadvantages of this technique include the need for the additional components of an optical encoder and sensor. This increases costs and the modification of an existing generator is required in order for the additional components to be installed. A no-load angle calibration is also required after each synchronisation.

The present disclosure provides a new method of determining a load angle and/or rotor angle in a synchronous electrical power generator for a power grid.

The disclosed technique differs from known techniques by measuring the field current of the generator to derive the generator's open circuit voltage (also known as back emf or induced emf) in addition to measuring the output voltage and current at a terminal of the generator. The field current is used to determine the open circuit voltage of the generator. The load angle and/or rotor angle is determined from the open circuit voltage of the generator and the output voltage and current at the terminal of the generator.

Advantages include accurate determination of the load angle and/or rotor angle both during steady state operation, during the transient period for out-of-synchronous protection and/or under high load conditions. In addition, the disclosed technique can be implemented at a low cost because there is no need for additional components such as an optical encoder and sensor.

Figure 1:
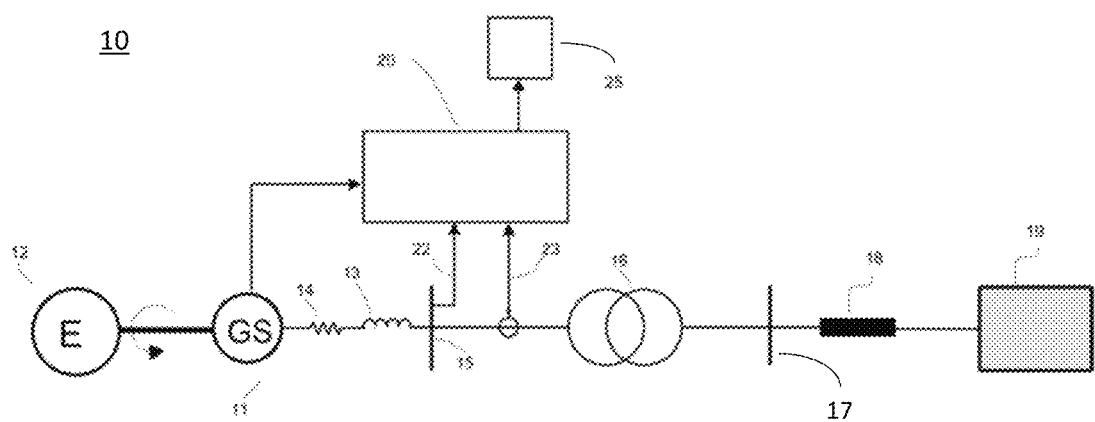
FIG. 1 shows the components of a generator system according to an embodiment.

FIG. 1 shows an generator system 10 according to an embodiment.

The generator system 10 comprises a engine/prime mover 12 that may, for example, be a reciprocating engine or gas/steam/wind turbine or a motor etc. The generator system 10 also comprises a synchronous electric generator 11 that has a terminal 15, unit transformer 16 and another terminal 17 at a point of common coupling (PCC). The unit transformer 16 is provided between the terminal 15 of the generator and the terminal 17 at the PCC. The engine 12 has shaft that is arranged to drive the generator 11 so that the generator 11 generates electrical power that is output from the generator terminal 15, through the unit transformer 16, through the terminal 17 and out of the generator system 10. The electrical power may be supplied to a transmission line 18 that supplies the electrical power to a power grid 19. These components of the generator system 10, and operation of the generator system 10, may be the same as for known generator systems.

The load angle (also referred to as power angle, rotor internal angle or internal rotor angle) is defined herein as the angular difference between the open circuit voltage of the generator 11 (also referred to as the open circuit armature voltage, no load voltage, emf, back emf, induced emf or internal voltage of the generator 11) and the voltage at the terminal 15 of the generator 11.

The rotor angle is defined herein as the angular difference between the open circuit voltage of the generator 11 (also referred to as the open circuit armature voltage, no load voltage, emf, back emf, induced emf or internal voltage of the generator 11) and the voltage at the terminal 17 at the PCC.

By monitoring only the load angle, only the rotor angle or both the load and rotor angle, the performance of the generator system 10 can be determined and an out-of-step condition detected depending on the operating condition.

The generator system 10 further comprises a voltage sensor 22 for measuring the voltage at the terminal 15 of the generator 11, i.e. the generator terminal voltage, a current sensor 23 for measuring the current at the terminal 15 of the generator 11, i.e. the generator terminal current, as well as a field current sensor in the generator 11 for measuring the field current.

The generator terminal voltage, generator terminal current and field current measurements may be time synchronised samples that are input to a computing device 20, that may be a digital signal processor. The computing device 20 may use the received generator terminal voltage, generator terminal current and field current measurements to calculate the load angle of the generator system 10. The computing device may output data to, for example, a display 25, and/or communicate data with other computing devices over a network.

Also shown in FIG. 1 are a resistor 14 and an inductor 13. These respectively represent the internal resistance and reactance of the generator 11.

Although not shown in FIG. 1, the generator system 10 may additionally, or alternatively to voltage sensor 22 and current sensor 23, have a voltage sensor for measuring the voltage at the terminal 17 at the PCC and a current sensor for measuring the current at the terminal 17 at the PCC. Together with the measurements from the field current sensor, the rotor angle of the generator system can be determined.

In the embodiments described below, only the load angle is determined. However, embodiments also include the same techniques being used to determine the rotor angle in dependence on voltage and current measurements from the terminal 17 at the PCC.

The derivation of the calculation technique according to the disclosure herein is explained in below.

The active power output, i.e. real power output, from the generator 11 with a cylindrical rotor structure can be defined as:

$$P = V_t I_t \cos(\theta) + R I_t^2 \qquad \text{equation 1}$$

where:
P is the active power output;
$V_t$ is the rms value of the generator terminal voltage;
$I_t$ is the rms value of the generator terminal current;
θ is the power factor angle; and
R is the internal resistance of the generator 11

Power factor angle, θ, is the angle between the generator terminal voltage and generator terminal current. The power factor angle can be determined from measurements of the generator terminal voltage and generator terminal current. The power factor of the generator system 10 is cos(θ).

The active power output from the generator 11 with a cylindrical rotor structure can also be defined as:

$$P = E I_t \cos(\partial - \theta) \qquad \text{equation 2}$$

where:
P, $I_t$, θ are as defined in equation 1;
E is the rms value of the open circuit voltage of the generator 11; and
∂ is the load angle By combining equations 1 and 2, the load angle for a generator 11 with a cylindrical rotor can be calculated as:

$$\delta = \theta + \cos^{-1}\left(\frac{V_t}{E}\cos\theta + \frac{RI_t}{E}\right) \quad \text{equation 3}$$

The computing device 20 may be configured to use equation 3 to calculate the load angle.

Advantageously, the determination of the load angle by equation 3 does not include the reactances of the system. The accuracy of the determination of the rotor is therefore unaffected by any reactance changes in the generator system 10 and the load angle can therefore be accurately calculated both during steady state operation and also during the transient period for out-of-synchronous protection.

Figure 2:
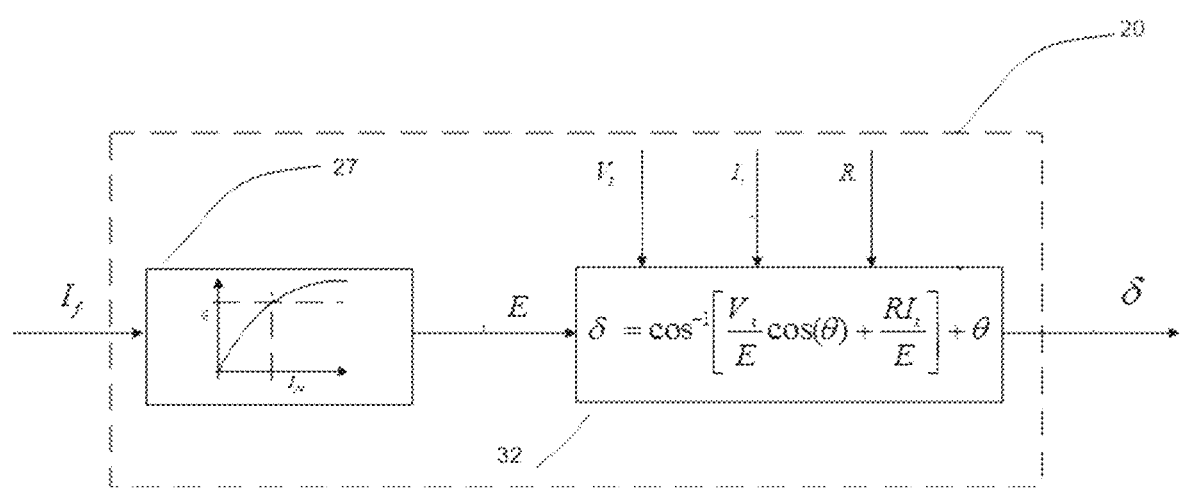
FIG. 2 shows the components of a computing device according to an embodiment.

FIG. 2 is a block diagram of the computing device 20. The computing device 20 comprises an open circuit characteristics, OCC, block 27 and an angle computation, AC, block 32. The measured field current is input to the OCC block 27. The OCC block 27 may use the field current and the open circuit characteristics of the generator 11 to determine the open circuit voltage of the generator 11.

Figure 3:
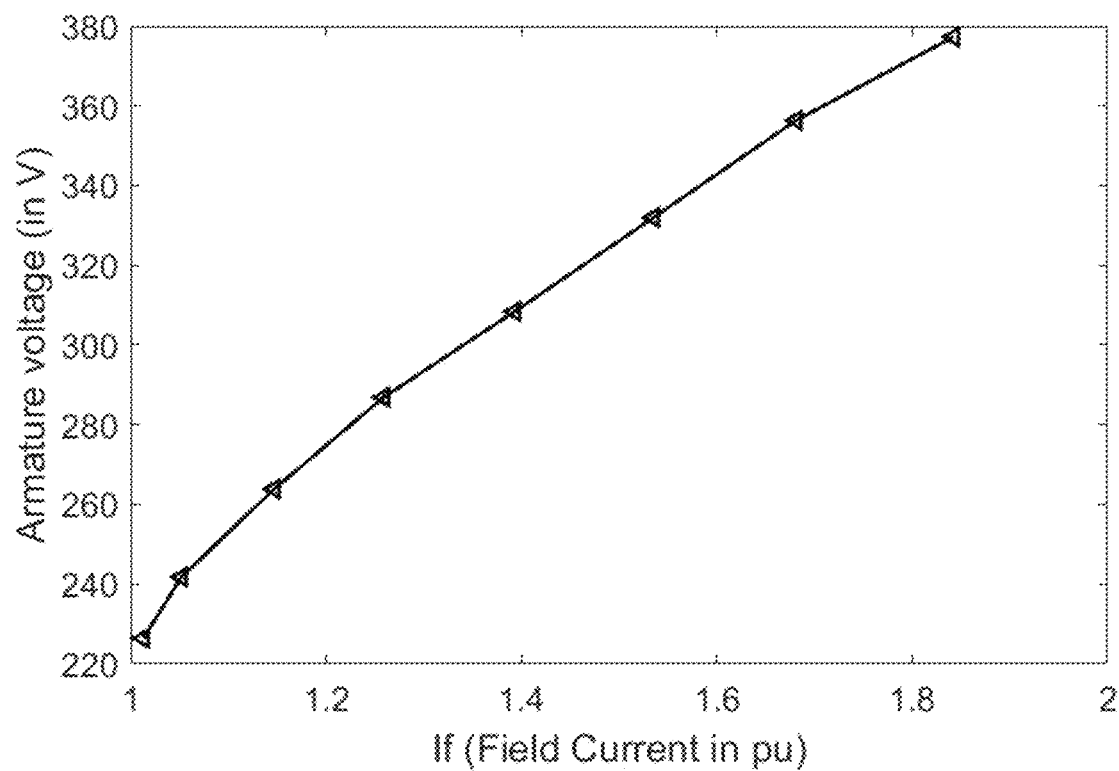
FIG. 3 shows how an open circuit voltage can be determined from a field current according to an embodiment.

FIG. 3 shows how the open circuit voltage of the generator 11 can be determined from the field current.

The open circuit characteristics of the generator 11 define the relationship between the field current and the open circuit voltage of the generator 11.

The OCC characteristics may be derived during one or more experiments during a factory acceptance test (FAT) of a generator when running the generator at no load and varying the field current within a controlled environment. The OCC characteristics can be represented as shown in FIG. 3. The horizontal axis represents various values of field current and the vertical axis represents various values of open circuit voltage of the generator stator. This data is provided to the OCC block 27 in, for example, a Look Up Table (LUT) or by a best-fit function relating the open circuit voltage to the field current. The open circuit Voltage may therefore be determined from an actual field current using an interpolation function, in the case of LUT data, or by equation evaluation in case of best-fit function. The open circuit characteristics may therefore be pre-determined data for the generator 11 that may be stored in the OCC block 27, stored elsewhere in the computing device 20 or stored remotely from the computing device 20 and provided to the computing device 20 when required. The open circuit characteristics of a generator 11 may be obtained through one or more of actual measurements, simulations, calculations and estimations. In FIG. 3, the rms value of the field current is displayed using the per-unit, pu, system. The determined open circuit voltage may be the rms value of the open circuit voltage.

The AC block 32 of the computing device 20 may receive as inputs the open circuit voltage from the OCC block 27, the measured generator terminal voltage, the measured generator terminal current and, if not already stored in the AC block 32, the internal resistance of the generator 11.

The AC block 32 may calculate the rms values of the received generator terminal voltage, generator terminal current and field current measurements. The received generator terminal voltage, generator terminal current and field current measurements may be filtered to remove any noise.

The internal resistance of the generator 11 may be pre-determined data for the generator 11 that may be stored in the AC block 32, stored in a computing device that comprises the computing device 20 or stored remotely from the computing device 20 and provided to the computing device 20 when required. The internal resistance of the generator 11 may be obtained through one or more of actual measurements, simulations, calculations and estimations.

The AC block 32 may determine the power factor angle from the received generator terminal voltage and generator terminal current measurements.

AC block 32 may use equation 3 to process the received data in order to determine the load angle. The determined load angle may be output from the computing device 20 to, for example, a display and/or another computing device for detecting an out-of-step condition.

When the generator 11 is a salient pole machine, the AC block 32 of the computing device 20 alternatively calculates the load angle as:

$$\delta = \cos^{-1}\left(\frac{V_t}{[E - (X_d - X_q)\sin(\delta - \theta)I_t]}\cos\theta + \frac{RI_t}{[E - (X_d - X_q)\sin(\delta - \theta)I_t]}\right) + \theta \quad \text{equation 4}$$

where:
δ, $V_t$, $I_t$, E, θ and R are as defined in equations 1 and 2;
$X_d$ is the nominal direct synchronous reactance of the generator 11; and
$X_q$ is the nominal quadrature axis synchronous reactance of the generator 11.

The values of R, $X_d$ and $X_q$ are pre-determined data for the generator 11 that may be stored in the AC block 32, stored in a computing device that comprises the computing device 20 or stored remotely from the computing device 20 and provided to the computing device 20 when required. The values of R, $X_d$ and $X_q$ for the generator 11 may be obtained through one or more of machine factory acceptance test (FAT) measurements, simulations, calculations and estimations.

For a 2.5 MVA, 400 V synchronous generator, typical values of R, $X_d$ and $X_q$ are:
R=0.000669767 Ohm, $X_d$=0.176625 Ohm and $X_q$=0.125 Ohm Advantageously, in the determination of the load angle by equation 4, only the difference between $X_d$ and $X_q$ is used and the variation of this difference with load is negligible with load change and does not significantly reduce the accuracy of the determination of the load angle.

FIG. 4 shows a comparison of determinations of rotor angle variations with active power output for a generator 11 with a cylindrical rotor.

FIG. 4 shows a measured value of rotor angle variation with active power output. FIG. 4 also shows the determined rotor angle variation with active power output with the rotor angle determined by the known technique disclosed in D. Sumina, "Synchronous Generator Rotor angle Measurement and Estimation", AUTOMATIKA 45(2004) 3-4, 179-186. FIG. 4 also shows the determined rotor angle variation with active power output with the rotor angle determined by the disclosure herein (i.e. in accordance with equation 3 with the voltage and current measurements obtained from the terminal 17 at the PCC).

FIG. 4 clearly shows that the determined rotor angle according to the disclosure herein remains accurate as the active power output increases to a high value. This is a clear improvement over the known technique for which the accuracy of the determined rotor angle decreases significantly.

The determined load angle and/or rotor angle may be output from the computing device 20 and used to determine if an out-of-step condition has occurred, or is about to occur, in accordance with known techniques.

An example of how the system may be operated is for the rotor angle of a generator 11 to be continuously determined. If the power output from the system is greater than, for example, 0.5 pµ and the determined rotor angle is determined to be out of an acceptable range of values for, for example, three consecutive time steps, an out-of-step condition may be detected and a protection relay may be triggered. Substantially real time protection of the generator 11 is therefore provided.

FIG. 5 is a flowchart of a process, according to the present disclosure, of determining a load angle and/or rotor angle of a generator system, wherein the generator system comprises a generator with a generator terminal for outputting electrical power generated by the generator, a transformer and a point of common coupling, PCC, terminal, wherein the transformer is arranged between the generator terminal and the PCC terminal.

In step 501, the process begins.

In step 503, the field current of the generator is determined.

In step 505, the output voltage from the generator terminal is determined, the output current from the generator terminal and the power factor angle and/or the power factor of the output voltage and output current from the generator terminal are determined, and the load angle of the generator system is determined in dependence on the determined field current, output voltage from the generator terminal, output current from the generator terminal and the power factor angle and/or the power factor.

In step 507, the output voltage from the PCC terminal is determined, the output current from the PCC terminal and the power factor angle and/or the power factor of the output voltage and output current from the PCC terminal are determined, and the rotor angle of the generator system is determined in dependence on the determined field current, output voltage from the PCC terminal, output current from the PCC terminal and the power factor angle and/or the power factor.

In step 509, the process ends.

Embodiments include a number of modifications and variations to the techniques as described above.

For example, it is not necessary for the computing device 20 to be comprised by the generator system 10 and the computing device 20 may alternatively be remote from the generator system 10 with the required data for calculating the load angle and/or rotor angle transmitted to the remote computing device 20.

Due to the power factor angle being a function of power factor, equations 3 and 4 could alternatively have defined the active power output in dependence on the power factor instead of the power factor angle. Embodiments include the computing device 20 determining and using the power factor, instead of the power factor angle, in the determinations of the load angle and/or rotor angle.

Embodiments are particularly appropriate for determining the load angle and/or rotor angle of a small generator 11 that supplies electrical power to a power grid 19, such as a smart grid or a micro grid. However, embodiments can be used to determine the load angle and/or rotor angle of any size of generator 11. Embodiments may also be used in other applications and with other types synchronous drives and prime movers (e.g. mechanical drive systems such as engines).

The determination of a load angle and/or rotor angle is described throughout embodiments. The determination of the load angle and/or rotor angle may alternatively be considered to be an estimation of the load angle and/or rotor angle.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

The invention claimed is:

1. A method of determining a load angle and/or rotor angle of a generator system comprising a generator that is a cylindrical rotor, the generator having a generator terminal for outputting electrical power generated by the generator, a transformer and a point of common coupling (PCC) terminal, the transformer being arranged between the generator terminal and the PCC terminal, the method comprising:

determining a field current of the generator;

determining an open circuit voltage of the generator in dependence on the field current and open circuit characteristics of the generator; and determining the load angle and/or rotor angle of the generator system in dependence on the determined open circuit voltage of the generator;

determining an output voltage from the generator terminal, an output current from the generator terminal and a generator power factor angle and/or a generator power factor of the output voltage and output current from the generator terminal, and determining the load angle of the generator system in dependence on the determined field current, output voltage from the generator terminal, output current from the generator terminal and the generator power factor angle and/or the generator power factor; and/or determining an output voltage from the PCC terminal, an output current from the PCC terminal and a PCC power factor angle and/or a PCC power factor of the output voltage and output current from the PCC terminal, and determining the rotor angle of the generator system in dependence on the determined field current, output voltage from the PCC terminal, output current from the PCC terminal and the PCC power factor angle and/or the PCC power factor, wherein the load angle is determined as:

$$\delta = \theta + \cos^{-1}\left(\frac{V_t}{E}\cos\theta + \frac{RI_t}{E}\right)$$

where:

$\delta$ is the rotor angle;

$V_t$ is the rms value of the output voltage from the generator terminal;

$I_t$ is the rms value of the output current from the generator terminal;

E is the rms value of determined open circuit voltage;

$\theta$ is the generator power factor angle; and

R is the internal resistance of the generator.

2. The method according to claim 1, wherein the generator system further comprises a mechanical drive system arranged to drive the generator so that the generator generates electrical power.

3. The method according to claim 1, wherein determining the output voltage and output current from the generator terminal and/or PCC terminal comprises measuring properties of the output voltage and output current.

4. The method according to claim 1, wherein determining the field current of the generator comprises measuring the field current of the generator.

5. The method according to claim 1, further comprising filtering one or more of the determined output voltage, output current and field current to remove noise components.

6. The method according to claim 1, wherein the open circuit characteristics of the generator are pre-determined data that have been one or more of calculated, simulated, estimated and measured.

7. The method according to claim 1, wherein the generator is a cylindrical rotor; and
the rotor angle is determined as:

$$\delta = \theta + \cos^{-1}\left(\frac{V_p}{E}\cos\theta + \frac{RI_p}{E}\right)$$

where:
$\delta$ is the rotor angle;
$V_p$ is the rms value of the output voltage from the PCC terminal;
$I_p$ is the rms value of the output current from the PCC terminal;
E is the rms value of determined open circuit voltage;
$\theta$ is the PCC power factor angle; and
R is the internal resistance of the generator.

8. The method according to claim 1, wherein the electrical power output from the generator system is less than 30 MW.

9. A method of determining whether or not an out-of-step condition has occurred, the method comprising:
determining a load angle and/or rotor angle of a generator system according to the method of claim 1; and
determining whether or not an out-of-step condition has occurred in dependence on the determined load angle and/or rotor angle.

10. A generator system comprising:
a generator with a generator terminal for outputting electrical power generated by the generator, a transformer and a point of common coupling (PCC) terminal, wherein the transformer is arranged between the generator terminal and the PCC terminal; and
one or more computing devices configured to determine an out-of-step condition according to the method of claim 9.

11. A computing device configured to determine a rotor angle of a generator system and/or an out-of-step condition by executing the computing program of claim 10.

12. A generator system comprising:
a generator with a generator terminal for outputting electrical power generated by the generator, a transformer and a point of common coupling (PCC) terminal, wherein the transformer is arranged between the generator terminal and the PCC terminal; and
one or more computing devices configured to determine a load angle and/or rotor angle of the generator system according to the method of claim 1.

13. A computer program that, when executed by a computing device, causes the computing device to determine a load angle and/or rotor angle of a generator system according to the method of claim 1 and/or an out-of-step condition.

14. A method of determining a load angle and/or rotor angle of a generator system comprising a generator that is a cylindrical rotor, the generator having a generator terminal for outputting electrical power generated by the generator, a transformer and a point of common coupling (PCC) terminal, the transformer being arranged between the generator terminal and the PCC terminal, the method comprising:
determining a field current of the generator;
determining an open circuit voltage of the generator in dependence on the field current and open circuit characteristics of the generator; and
determining the load angle and/or rotor angle of the generator system in dependence on the determined open circuit voltage of the generator;
determining an output voltage from the generator terminal, an output current from the generator terminal and a generator power factor angle and/or a generator power factor of the output voltage and output current from the generator terminal, and determining the load angle of the generator system in dependence on the determined field current, output voltage from the generator terminal, output current from the generator terminal and the generator power factor angle and/or the generator power factor; and/or
determining an output voltage from the PCC terminal, an output current from the PCC terminal and a PCC power factor angle and/or a PCC power factor of the output voltage and output current from the PCC terminal, and determining the rotor angle of the generator system in dependence on the determined field current, output voltage from the PCC terminal, output current from the PCC terminal and the PCC power factor angle and/or the PCC power factor,
wherein the rotor angle is determined as:

$$\delta = \theta + \cos^{-1}\left(\frac{V_p}{E}\cos\theta + \frac{RI_p}{E}\right)$$

where:
$\delta$ is the rotor angle;
$V_p$ is the rms value of the output voltage from the PCC terminal;
$I_p$ is the rms value of the output current from the PCC terminal;
E is the rms value of determined open circuit voltage;
$\theta$ is the PCC power factor angle; and
R is the internal resistance of the generator.

15. A method of determining a load angle and/or rotor angle of a generator system comprising a generator that is a salient pole machine, the generator having a generator terminal for outputting electrical power generated by the generator, a transformer and a point of common coupling (PCC) terminal, the transformer being arranged between the generator terminal and the PCC terminal, the method comprising:
determining a field current of the generator;
determining an open circuit voltage of the generator in dependence on the field current and open circuit characteristics of the generator; and
determining the load angle and/or rotor angle of the generator system in dependence on the determined open circuit voltage of the generator;
determining an output voltage from the generator terminal, an output current from the generator terminal and a generator power factor angle and/or a generator power factor of the output voltage and output current from the generator terminal, and determining the load angle of the generator system in dependence on the determined field current, output voltage from the generator terminal, output current from the generator terminal and the generator power factor angle and/or the generator power factor; and/or determining an output voltage from the PCC terminal, an output current from the PCC terminal and a PCC power factor angle and/or a PCC power factor of the output voltage and output current from the PCC terminal, and determining the rotor angle of the generator system in dependence on the determined field current, output voltage from the PCC terminal, output current from the PCC terminal and the PCC power factor angle and/or the PCC power factor, wherein the rotor angle is determined as:

$$\delta = \cos^{-1}\left(\frac{V_p}{[E-(X_d-X_q)\sin(\delta-\theta)I_p]}\cos\theta + \frac{RI_p}{[E-(X_d-X_q)\sin(\delta-\theta)I_p]}\right) + \theta$$

where:
$\delta$ is the rotor angle;
$V_p$ is the rms value of the output voltage from the PCC terminal;
$I_p$ is the rms value of the output current from the PCC terminal;
$E$ is the rms value of determined open circuit voltage;
$\theta$ is the PCC power factor angle;
$R$ is the internal resistance of the generator;
$X_d$ is the nominal direct synchronous reactance; and
$X_q$ is the nominal quadrature axis synchronous reactance.

* * * * *